US006951136B2

(12) United States Patent
Kato

(10) Patent No.: US 6,951,136 B2
(45) Date of Patent: Oct. 4, 2005

(54) SEMICONDUCTOR PRESSURE SENSOR DEVICE TO DETECT MICRO PRESSURE

(75) Inventor: Hajime Kato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 37 days.

(21) Appl. No.: 10/781,715

(22) Filed: Feb. 20, 2004

(65) Prior Publication Data

US 2005/0028603 A1 Feb. 10, 2005

(30) Foreign Application Priority Data

Aug. 5, 2003 (JP) ....................................... 2003-286725

(51) Int. Cl.[7] .................................................. G01L 9/16
(52) U.S. Cl. ......................................................... 73/754
(58) Field of Search .......................... 73/720, 721, 726, 73/727, 754, 756; 29/621.1, 25.35

(56) References Cited

U.S. PATENT DOCUMENTS 5,289,721 A * 3/1994 Tanizawa et al. ............. 73/727
5,320,705 A * 6/1994 Fujii et al. .................... 438/51
6,003,381 A 12/1999 Kato
6,066,882 A 5/2000 Kato
6,176,137 B1 * 1/2001 Sasaki et al. ................. 73/754
6,186,009 B1 * 2/2001 Miyano et al. ............... 73/756
6,401,542 B1 6/2002 Kato

FOREIGN PATENT DOCUMENTS

JP 8-21774 1/1996

* cited by examiner

*Primary Examiner*—William Oen
(74) *Attorney, Agent, or Firm*—Oblon, Spivak, McClelland, Maier & Neustadt, P.C.

(57) ABSTRACT

The present invention is related to a semiconductor pressure sensor device employed for an application of a micro pressure and includes a thin part constituting a diaphragm, a thick part surrounding the thin part, a strain gage element formed on a surface of the diaphragm in a side of the one main surface, for detecting a pressure, a semiconductor sensor substrate having a first concave part formed by the thin part and the thick part, having an opening part in the other main surface, and whose bottom part corresponds to the thin part, and a support member comprising a second concave part and the support member is fixed on the thick part of the semiconductor sensor substrate in a side of the other main surface so that an opening part of the second concave part faces with the opening part of the first concave part and has a positional relationship to be included in the opening part of the first concave part in a plane view.

4 Claims, 2 Drawing Sheets

F I G . 1
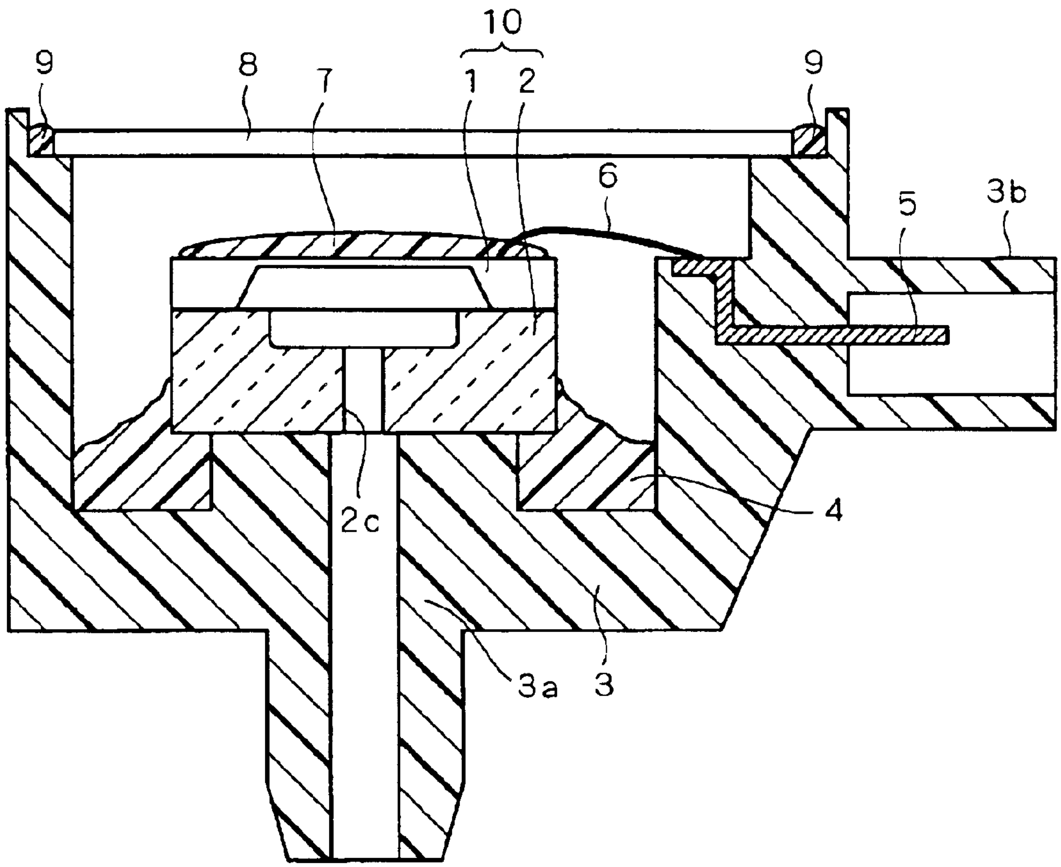

F I G . 2
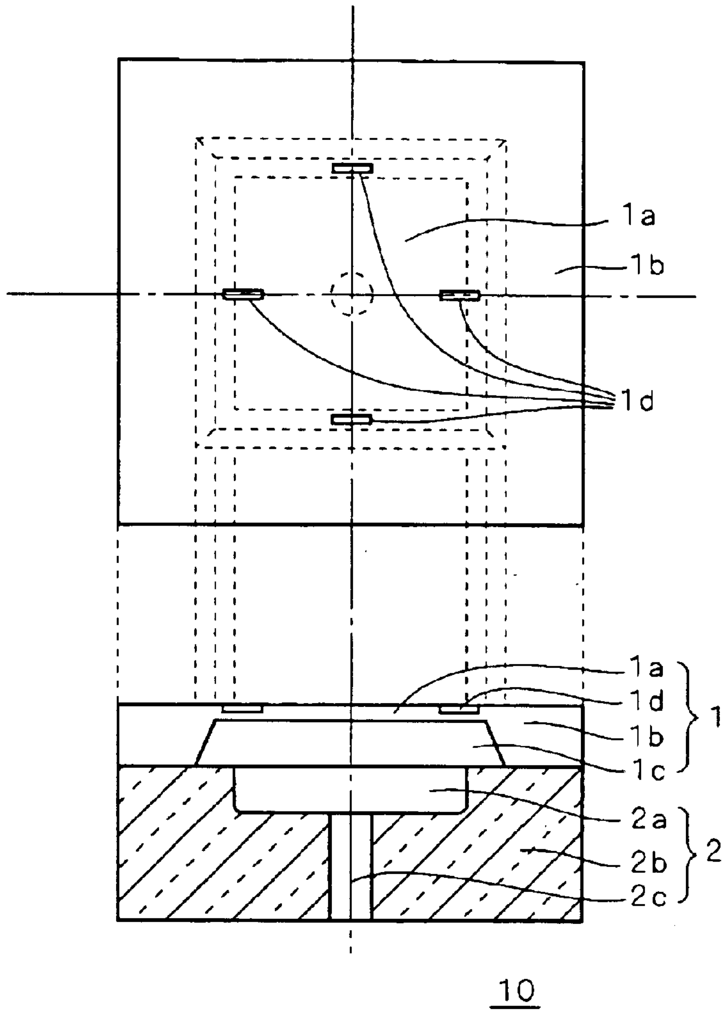
F I G . 3
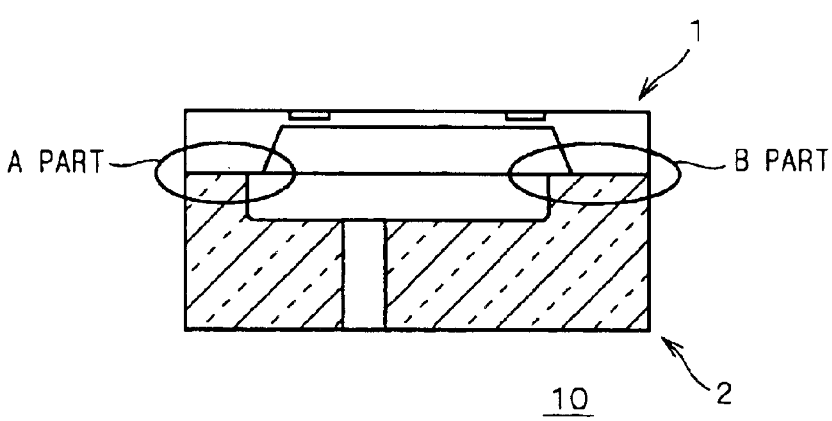

SEMICONDUCTOR PRESSURE SENSOR DEVICE TO DETECT MICRO PRESSURE

BACKGROUND OF THE INVENTION

1. Field of the Invention

The present invention relates to a semiconductor pressure sensor device, and more particularly, it relates to a semiconductor pressure sensor device employed for an application of a micro pressure such as tank internal pressure sensors detecting gasoline leakages of vehicles, and so on.

2. Description of the Background Art

The semiconductor pressure sensor device detects a pressure employing an effect converting a pressure added to a semiconductor into an electronic signal. A device which includes a semiconductor sensor substrate having a diaphragm of appropriate thickness for generating a predetermined electronic signal corresponding to a predetermined pressure and a glass base as a support member to fix the semiconductor sensor substrate is known as such a semiconductor pressure sensor device.

There is a sensor such as shown in FIG. 1 of Japanese Patent Application Laid-Open No. 8-21774 (1996) (pp. 3 and 4) as the semiconductor pressure sensor having a composition described above. The semiconductor pressure sensor which is known conventionally employs a circular diaphragm changing corresponding to a pressure difference on its both surfaces. This diaphragm is formed in a square semiconductor sensor substrate composed of a single-crystal silicon substrate having a stress sensor formed on one surface of it. Four strain gage elements are formed on the periphery of the diaphragm and detect a stress on the diaphragm. These strain gage elements indicates a piezoresistance characteristic and the resistance changes corresponding to the stress experienced by the sensor. Furthermore, a circular cavity is formed by a silicon etching in the surface opposite to the surface where the strain gage elements are placed to form the diaphragm. Moreover, a support member composed of a borosilicate glass is joined on the other main surface of the semiconductor sensor substrate.

In the meantime, the support member has a through-hole which becomes a circular stress leading-in hole in the proximity of its center part and is connected with the surface opposite to the surface where the strain gage elements are formed. Moreover, a circular supporting part surrounding the diaphragm and moreover being concentric with this is placed in higher level than its periphery by several μm on a bonding region of the support member facing with a thick part surrounding the diaphragm of the semiconductor sensor substrate. According to this, a shape of the bonding region becomes circular and a zero shift phenomenon caused by a condition that the shape of the bonding region with the support member is not symmetrical to a shape of the diaphragm is prevented.

In case of a silicon etching described above, an etching velocity changes corresponding to a temperature of an etching solution and a concentration of an etchant, thus a homogenization of the solution temperature and the etchant concentration is provided by rotating the silicon substrate in the etching solution, however, there is a tendency that a turbulent flow occurs in a cavity adjacent to the diaphragm in case that an etching amount of the silicon in a depth direction increases, a temperature difference and an etchant concentration difference come to occur easily, and then a thickness of a periphery part is reduced in size as compared with a central part of the diaphragm. The thickness of the silicon substrate is 400 μm, and the thickness of the diaphragm is approximately 18 μm, thus a reasonable technique is necessary to control the thickness of the diaphragm in the conventional technique described above also, however, it is necessary to reduce moreover the thickness of the diaphragm to obtain a stable signal with a fair S/N Ratio in a micro pressure measurement, and consequently, the etching amount of the silicon gets to increase, and according to this, the thickness of the diaphragm varies furthermore widely, and at worst, there is a case that a hole is formed in the diaphragm in part.

In the meantime, when the thickness of the silicon substrate is reduced in advance, the thickness of the diaphragm can be reduced by reason that the etching amount decreases and the difference lessens, however in the meantime, the thickness of the thick part is also reduced. When the thick part is thick enough, a bonding stress with the support member can be absorbed and thus an influence upon the diaphragm can be curbed, however, when the thickness of the thick part is reduced, a problem arises that the bonding stress cannot be absorbed in the thick part sufficiently, the diaphragm provides a larger strain, a resistance value of the strain gage element formed on the semiconductor sensor substrate changes, and these conditions cause a drop of an initial characteristic. Consequently, 400 μm in thickness is necessary for the silicon substrate.

In case of Japanese Patent Application Laid-Open No. 8-21774, the zero shift phenomenon caused by a condition that the shape of the bonding region with the support member is not symmetrical to the shape of the diaphragm is prevented by forming the circular supporting part surrounding the diaphragm and moreover being concentric with this higher than its periphery on the bonding region of the support member facing with the thick part surrounding the diaphragm of the semiconductor sensor substrate and also making the shape of the bonding region circular, however, the subject described above is not recognized. Furthermore, in case that a slippage of a position unavoidable upon a manufacturing process occurs when the semiconductor sensor substrate and the support member are joined with each other, the symmetry of the shape of the bonding region with the support member to the shape of the diaphragm cannot still be secured, and thus the occurrence of the zero shift phenomenon is concerned.

SUMMARY OF THE INVENTION

It is an object of the present invention to provide a semiconductor pressure sensor device which can obtain a stable signal with a fair S/N Ratio in a micro pressure measurement by reducing a thickness of a diaphragm without causing a drop of an initial characteristic.

An aspect of the semiconductor pressure sensor device according to the present invention includes a semiconductor sensor substrate having one and other main surfaces facing and being in parallel with each other and a support member on which the semiconductor sensor substrate is mounted. Moreover, the semiconductor sensor substrate includes a thin part constituting a diaphragm, a thick part surrounding the thin pat, a strain gage element formed on a surface of the diaphragm in a side of the one main surface, for detecting a pressure, and a first concave part formed by the thin part and the thick part, having an opening part in the other main surface, and whose bottom part corresponds to the thin part. The support member includes a second concave part and is placed such that said support member is fixed on the thick part of the semiconductor sensor substrate in a side of the other main surface so that an opening part of the second concave part faces with the opening part of the first concave part and has a positional relationship to be included in the opening part of the first concave part in a plane view.

According to the constitution as described above, the stable signal with the fair S/N Ratio can be obtained in the micro pressure measurement, too, by reason that the thickness of the diaphragm can be controlled with accuracy, and moreover, the drop of the initial characteristic caused by reducing the thickness of the semiconductor sensor substrate can be prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view illustrating a preferred embodiment of a semiconductor pressure sensor device according to the present invention.

FIG. 2 is a plan view and a cross-sectional view taking only a sensor assembly part from FIG. 1.

FIG. 3 is an explanation drawing in case that a semiconductor sensor substrate and a glass base are in anode bonding with a position slipped.

DESCRIPTION OF THE PREFERRED EMBODIMENTS

The preferred embodiment of the present invention is described on the basis of the drawings hereinafter. FIG. 1 is the cross-sectional view illustrating the preferred embodiment of the semiconductor pressure sensor device according to the present invention, and FIG. 2 is the plan view and the cross-sectional view taking only the part of the sensor substrate assembly 10 from FIG. 1.

In FIG. 2, a semiconductor sensor substrate 1 is composed of silicon, has two parallel main surfaces facing with each other, is a square substrate of 150 to 250 μm in thickness and 3 mm on a side, and includes a square diaphragm 1*a* of 13 μm in thickness and 1.4 mm on a side existing in a center part of the substrate, a thick part 1*b* having the same thickness as the substrate and exiting in a periphery part of the substrate, and the square first concave part 1*c* regulated by the diaphragm 1*a* and the thick part 1*b* and having an opening part in the other main surface. Four strain gage elements 1*d* are formed on a surface of the diaphragm 1*a* in the side of one main surface of the semiconductor sensor substrate 1 with employing a known semiconductor process.

A glass base 2 as a support member reinforcing and supporting the semiconductor sensor substrate 1 is placed on the other main surface of the semiconductor sensor substrate 1. The glass base 2 has two parallel main surfaces and has a square shape of 2 mm in thickness and 3 mm on a side, and it is made of a borosilicate glass having a thermal expansion coefficient similar to silicon. A second concave part 2*a* is provided to have an opening part on one main surface in a center part of the glass base 2, and is surrounded by a thick part 2*b*. The semiconductor sensor substrate 1 and the glass base 2 are in anode bonding hermetically and tightly with each other in the respective thick parts (1*b* and 2*b*) so that the other main surface of the semiconductor sensor substrate 1 and the one main surface of the glass base 2 are faced with each other. The second concave part 2*a* has a square shape having a side shorter than the side of the square diaphragm 1*a* by approximately 500 μm with considering an error in an alignment to prevent a joint surface of the semiconductor sensor substrate 1 from overlapping the opening part of the second concave part 2*a* in case of the alignment of the semiconductor sensor substrate 1 with the glass base 2 in anode bonding, and its depth is 150 μm or more. Moreover, a circular through-hole 2*c* which becomes a stress leading-in hole is formed in the center part of the glass base 2 to join the one main surface with the other main surface. A pressure to be measured is introduced into a space regulated by the first concave part 1*c* and the second concave part 2*a* through the through-hole 2*c*, the diaphragm 1*a* is modified by the pressure, and the pressure is converted into an electronic signal by the four strain gage elements 1*d* formed on the diaphragm 1*a*.

The sensor substrate assembly 10 constituted as described above includes a connector part 3*b*, is took inside of a resin package 3 having a cavity inside, is placed on a nipple 3*a* for a pressure introduction to align with the through-hole 2*c*, and fixes the sensor substrate assembly 10 and prevents the pressure from leaking from the nipple 3*a* by filling a silicone resin 4 up to a side surface of the glass base 2 in the peripheral cavity. A lead 5 is provided in the connected part 3*b* of the resin package 3, is connected with the semiconductor sensor substrate 1 through a wire 6, and takes the electronic signal converted from the pressure by the semiconductor sensor substrate 1 outside through the wire 6 and the lead 5. The surface of the semiconductor sensor substrate 1 is covered with a silicone resin 7 for a purpose of protection, and moreover, an inside of the resin package 3 is protected by sealing a cavity part of the resin package 3 with a cover 8 and an adhesives 9.

The diaphragm 1*a* of the semiconductor sensor substrate 1 is formed by removing a predetermined part in the other main surface of the silicon substrate by an etching and by making it have a predetermined thickness. An etching solution such as a potassium hydroxide solution that an etching velocity has anisotropy against a crystal axis of silicon is generally employed for this etching. According to this, a shape of a formed cavity, that is to say, a shape of the diaphragm becomes a rectangle including a square. As described above, as for such an etching, the thickness of the diaphragm tends to vary widely due to an increase of the etching amount, however in the present preferred embodiment, the thickness of the semiconductor sensor substrate 1, that is to say, the thickness of the silicon substrate is set to be from 400 μm to 250 μm or less, thus the increase of the etching amount does not occur, and it becomes possible to form the diaphragm of little difference and less thickness. According to the above description, it is preferable to make the thickness of the semiconductor sensor substrate 1 small from the aspect of an accuracy of the diaphragm thickness, however, 150 μm or more is necessary to maintain a basic strength in case of a handling of the substrate in a manufacturing process.

In this manner, the difference of the thickness of the diaphragm becomes small by reducing the thickness of the silicon substrate, however, in the meantime, there is a problem that the diaphragm 1*a* gets a strain from the stress generated due to a bonding with the glass base 2 and causes the drop of the initial characteristic of the strain gage element 1*d*. A temperature in case of the anode bonding of the semiconductor sensor substrate 1 with the glass base 2 is high, such as 380 to 430° C., thus the stress is generated in the bonding surface when returning to room temperature due to a difference of the thermal expansion coefficient of silicon with the borosilicate glass, however, when the thickness of the silicon substrate becomes small, that is to say, when the depth to the diaphragm 1*a* becomes small, an influence of the stress by a contraction of the glass base 2 extends to the diaphragm 1*a* easily, thus the initial characteristic brings about a significant influence.

Consequently, in the present preferred embodiment, a strain generated by the stress described above is absorbed by not only the thick part 1*b* of the semiconductor sensor substrate 1 but also the thick part 2*b* of the glass base 2 by forming the second concave part 2*a* in the glass base 2, and the strain which the stress described above provides for the diaphragm 1*a* is relaxed. According to this, it becomes possible to prevent the drop of the initial characteristic caused by reducing the thickness of the silicon substrate. For this purpose, the amount of the thickness reduced from the semiconductor sensor substrate 1 or more is necessary for the depth of the second concave part 2*a*, that is to say, in case that the thickness of the semiconductor sensor substrate 1 is 250 μm, the depth of the second concave part 2*a* is 150 μm (400 μm–250 μm) or more. Furthermore, when a case that the thickness of the semiconductor sensor substrate 1 is set to be 150 μm so as to correspond to the reduction of the thickness of the diaphragm is considered for the micro pressure measurement, the depth of the second concave part 2*a* is preferably 250 μm (400 μm–150 μm) or more.

What is important here is that the opening part of the second concave part 2*a* needs to be aligned to be included in the opening part of the first concave part 1*c* in case of the anode bonding of the semiconductor sensor substrate 1 with the glass base 2. For example, when the semiconductor sensor substrate 1 and the glass base 2 are in anode bonding with each other with the position slipped such as the illustration in FIG. 3, a problem arises first that an offset occurs upon an output voltage without the pressure by reason that a symmetry of a geometrical positional relationship of a bonding with the strain gage element is lost in an A part and a B part in FIG. 3. A problem arises secondly that a bonding area of the A part becomes smaller than the other part and thus a bonding strength of the A part becomes smaller than design values. Consequently, in the present preferred embodiment, the second concave part 2*b* has a square shape having the side shorter than the side of the square diaphragm 1*a* by approximately 500 μm with considering the allowable error of the alignment in anode bonding, thus the opening part of the second concave part 2*a* is always included in the opening part of the first concave part 1*c*. Consequently, the shape of the bonding is always equal to the shape of the joint surface of the semiconductor sensor substrate, thus the symmetry of the geometrical positional relationship of the bonding with the strain gage element 1*d* is not lost, and the bonding area is also determined according to the shape of the bonding surface of the semiconductor sensor substrate, thus it is also possible to maintain the predetermined design values of the bonding strength, and the problem as described above can be prevented.

In the present preferred embodiment, the semiconductor pressure sensor device having the square diaphragm is described, however, it goes without saying that a major point of the present invention is also applicable to a semiconductor pressure sensor device having a circular diaphragm. In that case, the concave part should be changed into a circular form and its diameter should be shorter than the diameter of the circular diaphragm by the amount of the allowable error of the alignment, and by doing this way, the opening part of the concave part of the glass base is included in the opening part of the first concave part of the semiconductor sensor substrate after the anode bonding of the semiconductor sensor substrate with the glass base, thus the similar effect can be seen. However, the semiconductor sensor substrate has the rectangular shape generally, thus it is more desirable preferred embodiment that a section of the opening part of the first concave part has the rectangular shape and a section of the opening part of the concave part of the glass base has the rectangular shape such as the present preferred embodiment in order to prevent the zero shift phenomenon caused by a condition that the shape of the bonding region with the support member is not symmetrical to the shape of the diaphragm, too.

While the invention has been shown and described in detail, the foregoing description is in all aspects illustrative and not restrictive. It is therefore understood that numerous modifications and variations can be devised without departing from the scope of the invention.

What is claimed is:

1. A semiconductor pressure sensor device, comprising:

a semiconductor sensor substrate having one and other main surfaces facing and being in parallel with each other; and a support member on which said semiconductor sensor substrate is mounted, wherein said semiconductor sensor substrate comprises a thin part constituting a diaphragm;

a thick part surrounding said thin part;

a strain gage element formed on a surface of said diaphragm in a side of said one main surface, for detecting a pressure; and a first concave part formed by said thin part and said thick part, having an opening part in said other main surface, and whose bottom part corresponds to said thin part, wherein said support member comprises a second concave part, wherein said support member is fixed on said thick part of said semiconductor sensor substrate in a side of said other main surface so that an opening part of said second concave part faces with said opening part of said first concave part and has a positional relationship to be included in said opening part of said first concave part in a plane view.

2. The semiconductor pressure sensor device according to claim 1, wherein a thickness of said thick part of said semiconductor sensor substrate is no fewer than 150 μm, nor more than 250 μm.

3. The semiconductor pressure sensor device according to claim 2, wherein a depth of said second concave part of said support member is no fewer than 150 μm.

4. The semiconductor pressure sensor device according to claim 1, wherein sections of said opening parts of said first and second concave parts have a rectangular shape, respectively.

* * * * *